United States Patent
Iwamoto et al.

(10) Patent No.: US 8,038,798 B2
(45) Date of Patent: Oct. 18, 2011

(54) METHOD OF AND APPARATUS FOR CLEANING SUBSTRATE

(75) Inventors: Hayato Iwamoto, Kanagawa (JP); Noriaki Adachi, Kyoto (JP)

(73) Assignees: Sony Corporation (JP); Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 12/124,555

(22) Filed: May 21, 2008

(65) Prior Publication Data

US 2008/0295862 A1 Dec. 4, 2008

(30) Foreign Application Priority Data

May 28, 2007 (JP) ................. 2007-140099

(51) Int. Cl.
*C23G 1/02* (2006.01)
(52) U.S. Cl. ........... 134/2; 134/3; 134/18; 134/26; 134/27; 134/28; 134/34; 134/36; 134/41; 134/42; 134/113; 134/186; 134/902
(58) Field of Classification Search ............ 134/2, 3, 134/18, 26, 27, 28, 34, 36, 41, 42, 113, 186, 134/902
See application file for complete search history.

(56) References Cited

U.S. PATENT DOCUMENTS

| | | | | |
|---|---|---|---|---|
| 5,826,601 A * | 10/1998 | Muraoka et al. | ........ | 134/2 |
| 5,845,660 A * | 12/1998 | Shindo et al. | ........ | 134/56 R |
| 6,392,417 B1 * | 5/2002 | Knotter et al. | ........ | 324/439 |
| 2005/0081886 A1 * | 4/2005 | Miyazaki et al. | ........ | 134/2 |
| 2006/0043073 A1 | 3/2006 | Shirakawa et al. | | |
| 2006/0213538 A1 * | 9/2006 | Umezawa et al. | ........ | 134/18 |
| 2008/0202559 A1 | 8/2008 | Miyazaki et al. | | |

FOREIGN PATENT DOCUMENTS

| | | |
|---|---|---|
| CN | 1311520 C | 4/2007 |
| JP | H04-074420 | 3/1992 |
| JP | 5-3186 | 1/1993 |
| JP | 8-103739 | 4/1996 |
| JP | H09-162156 | 6/1997 |
| JP | 2000-68241 | 3/2000 |
| JP | 2001-279477 | 10/2001 |
| JP | 2005-101572 | 4/2005 |
| JP | 2006-253552 | 9/2006 |
| JP | 2008-103435 | 5/2008 |
| KR | 0390545 | 9/2003 |

OTHER PUBLICATIONS

Korean Office Action dated Mar. 25, 2010 in corresponding Korean Patent Application (Dispatch) No. 9-5-2010-012490418 with English language translation).

(Continued)

*Primary Examiner* — Bibi Carrillo
(74) *Attorney, Agent, or Firm* — Ostrolenk Faber LLP (57) ABSTRACT

A substrate cleaning apparatus is capable of individually setting a threshold value for use in making a check of a resistivity during a rinsing process on a recipe setting screen in each process step. Thus, by setting each threshold value depending on the type of liquid chemical to be used immediately before the rinsing process, the substrate cleaning apparatus can use an optimum threshold value during the rinsing process in each process step to make a check of the resistivity. This allows the proper completion of the rinsing process in each process step.

3 Claims, 4 Drawing Sheets

OTHER PUBLICATIONS

Chinese Office Action dated Nov. 16, 2009 in corresponding Chinese Patent Application No. 2008101005420 (with English language translation).

Japanese Office Action issued by the Japanese Patent Office on Apr. 19, 2011 in connection with corresponding Japanese Patent Application No. 2007-140099 (with English Translation).

Office Action issued by the Chinese Patent Office on Dec. 21, 2010 in connection with corresponding Chinese Patent Application No. 200810100542.0.

Japanese translation of Chinese Office Action issued in connection with Chinese Patent Application No. 200810100542.0 on Dec. 21, 2010.

English translation of Japanese translation of Chinese Office Action issued in connection with Chinese Patent Application No. 200810100542.0 on Dec. 21, 2010.

Japanese Office Action issued by the Japanese Patent Office on Jul. 19, 2011 in connection with corresponding Japanese Patent Application No. 2007-140099 (with English Translation).

* cited by examiner

| Process Step | Processing Time | HF | HH4OH | HCl | H2O2 | DIW | Threshold Value for Resistivity Check |
|---|---|---|---|---|---|---|---|
| 1 | 200 | ● | | | | ● | 0 |
| 2 | 600 | | | | | ● | 800 |
| 3 | 600 | | ● | | ● | ● | 0 |
| 4 | 600 | | | | | ● | 1000 |
| 5 | 600 | | | ● | ● | ● | 0 |
| 6 | 600 | | | | | ● | 1000 |

Prior Art

FIG. 5

| Process Step | Time | HF | HH4OH | HCl | H2O2 | DIW | Resistivity Check |
|---|---|---|---|---|---|---|---|
| 1 | 200 | ● | | | | ● | |
| 2 | 600 | | | | | ● | ● |
| 3 | 600 | | ● | | ● | ● | |
| 4 | 600 | | | | | ● | ● |
| 5 | 600 | | | ● | ● | ● | |
| 6 | 600 | | | | | ● | ● |

METHOD OF AND APPARATUS FOR CLEANING SUBSTRATE

BACKGROUND OF THE INVENTION

1. Field of the Invention

The present invention relates to a substrate cleaning apparatus which sequentially performs a liquid chemical process and a rinsing process in a single processing bath upon a substrate to be processed such as a semiconductor wafer, a glass substrate for a liquid crystal display device, a glass substrate for a photomask and the like.

2. Description of the Background Art

Heretofore, there has been known a substrate cleaning apparatus of what is called a one-bath type which sequentially performs a liquid chemical process and a rinsing process upon a substrate within a single processing bath in a substrate manufacturing process. The substrate cleaning apparatus of the one-bath type performs the liquid chemical process on a substrate by immersing the substrate in a liquid chemical stored in the processing bath and causing the liquid chemical to overflow through a top portion of the processing bath while supplying the liquid chemical to the processing bath through a bottom portion thereof. After the completion of the liquid chemical process for a predetermined period of time, the substrate cleaning apparatus of the one-bath type gradually replaces the liquid chemical in the processing bath with deionized water by supplying deionized water to the processing bath through the bottom portion thereof. Then, the substrate cleaning apparatus of the one-bath type performs the rinsing process for a predetermined period of time while causing the deionized water to overflow through the top portion of the processing bath.

Such a background art substrate cleaning apparatus measures the resistivity of the deionized water stored in the processing bath after a lapse of a predetermined time period since the start of the rinsing process. When the measured resistivity is not less than a predetermined threshold value, the substrate cleaning apparatus does not judge that impurities such as liquid chemical components remain in the processing bath, and completes the rinsing process successfully. When the measured resistivity is less than the predetermined threshold value, on the other hand, the substrate cleaning apparatus judges that impurities such as liquid chemical components remain in the processing bath, and issues an alarm to an operator. In this manner, the background art substrate cleaning apparatus controls the operation of completing the rinsing process, based on the resistivity of deionized water.

Figure 4:
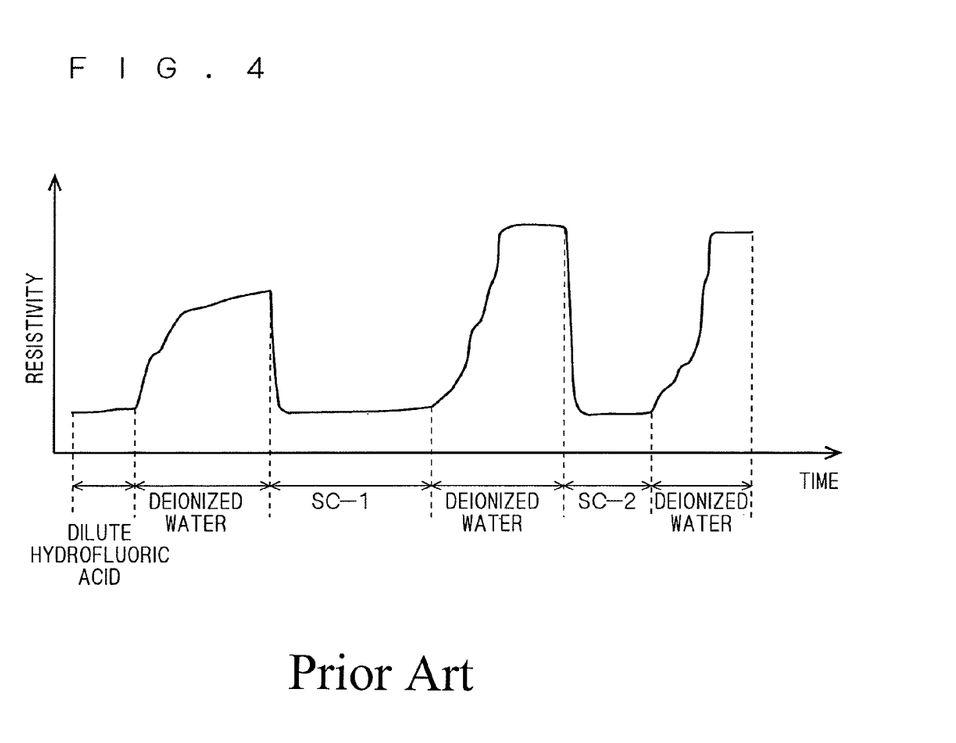
FIG. 4 is a graph showing an example of variations in resistivity in a substrate cleaning apparatus of a one-bath type.

FIG. 4 is a graph showing an example of variations in the resistivity of liquids in the processing bath when the substrate cleaning apparatus of the one-bath type performs a cleaning process while replacing the liquids in the following order: dilute hydrofluoric acid (a liquid chemical), deionized water, an SC-1 (standard cleaning 1; $NH_4OH-H_2O_2-H_2O$) solution (a liquid chemical), deionized water, an SC-2 (standard cleaning 2; $HC_1-H_2O_2-H_2O$) solution (a liquid chemical), and deionized water. As shown in FIG. 4, the resistivity of liquids decreases during the liquid chemical process, and recovers during the rinsing process. The background art substrate cleaning apparatus completes the rinsing process successfully after recognizing that such a resistivity recovers to at least a predetermined threshold value. However, as shown in FIG. 4, the recovery curve of the resistivity during the rinsing process varies significantly depending on the type of chemical liquid used in the immediately preceding liquid chemical process. For example, the resistivity tends to increase less during the rinsing process subsequent to the liquid chemical process using the dilute hydrofluoric acid than during the rinsing process subsequent to the liquid chemical processes using the SC-1 solution and the SC-2 solution.

Figure 5:
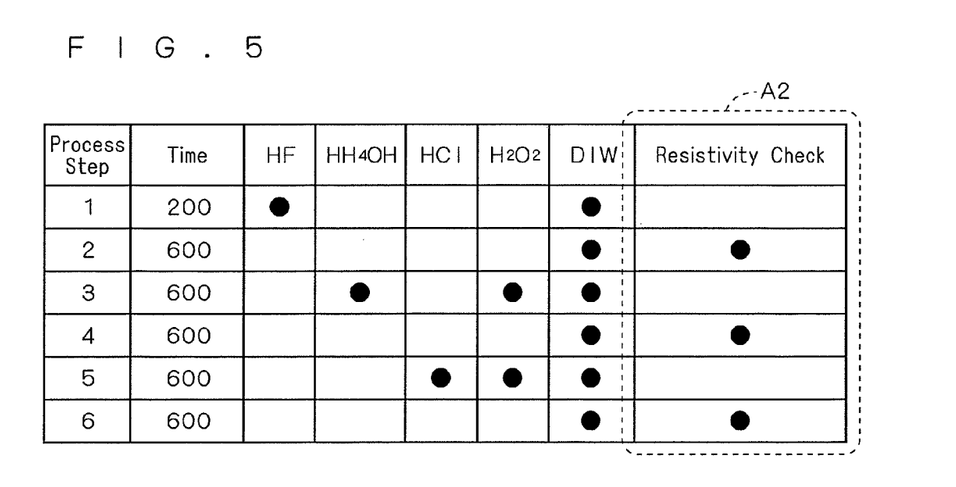
FIG. 5 shows an example of a background art recipe setting screen.

On the other hand, the background art substrate cleaning apparatus uses a recipe setting screen as illustrated in FIG. 5 to define the processing details of the liquid chemical process and the rinsing process. Whether to make a check of the resistivity at the completion of each process or not is also defined on the recipe setting screen (an area A2 in FIG. 5), and the threshold value serving as a criterion of the check is specified as a single value in other parameter files. For this reason, the background art substrate cleaning apparatus cannot set the threshold value of the resistivity at different values depending on the type of chemical liquid used in the liquid chemical process despite the fact that the recovery curve of the resistivity varies depending on the type of chemical liquid as discussed above.

To prevent the decrease in yield and in device characteristics in a semiconductor device manufacturing process, the substrate cleaning apparatus of the one-bath type as discussed above is used to clean a semiconductor wafer, thereby removing particles and metallic impurities from the surface of the semiconductor wafer. There is, however, apprehension that the resistivity of liquid does not sufficiently recover during the rinsing process under circumstances where the threshold value of the resistivity cannot be set individually depending on the type of liquid chemical as described above. This might cause a liquid chemical component to remain on the surface of the semiconductor wafer after the rinsing process, whereby the liquid chemical component gives rise to the decrease in yield and in device characteristics, even when the liquid chemical process removes particles and metallic impurities from the surface of the semiconductor wafer. In particular, there is a danger that reliability problems such as a withstand voltage failure of a gate insulation film come up in the step of forming the gate insulation film and in the step of forming a capacitor.

In the step of forming the gate insulation film on the surface of the semiconductor wafer, for example, a cleaning process as described above (i.e., the cleaning process performed while the liquids are replaced in the following order: dilute hydrofluoric acid, deionized water, the SC-1 solution, deionized water, the SC-2 solution, and deionized water) is performed as pre-cleaning. In such a case, insufficient removal of the liquid chemical component during the rinsing process subsequent to the liquid chemical process might give rise to problems to be described below.

Dilute hydrofluoric acid is used mainly for the removal of a sacrificial oxide film. If a dilute hydrofluoric acid component remains after the rinsing process, there is a danger that the dilute hydrofluoric acid component deteriorates the roughness of a silicon surface on which the gate insulation film is to be formed. Additionally, the dilute hydrofluoric acid component leads to the expansion of crystal defects and pits in the silicon surface to roughen the film quality of the gate insulation film to be formed thereafter, which might result in the decrease in reliability such as the withstand voltage failure of the gate insulation film.

The SC-1 solution is used mainly for the removal of particles. If an ammonia component in the SC-1 solution remains after the rinsing process, there is a danger that the ammonia component deteriorates the roughness of the silicon surface on which the gate insulation film is to be formed. Additionally, the ammonia component leads to the expansion of crystal defects and pits in the silicon surface to roughen the film quality of the gate insulation film to be formed thereafter, which might result in the decrease in reliability such as the withstand voltage failure of the gate insulation film.

The SC-2 solution is used mainly for the removal of metallic impurities. If a chloride component in the SC-2 solution remains after the rinsing process, light metal such as calcium (Ca) is liable to adhere to the surface of the semiconductor wafer. Thus, the light metal adhering to the surface becomes particles, which might cause the withstand voltage failure of the gate insulation film.

SUMMARY OF THE INVENTION

The present invention is intended for a method of cleaning a substrate, the method including sequentially performing a liquid chemical process using a liquid chemical and a rinsing process using deionized water upon a substrate in a single processing bath.

According to the present invention, the method comprises the steps of: a) setting a threshold value for use in checking a resistivity during the rinsing process, depending on the type of chemical liquid for use in a liquid chemical process immediately preceding the rinsing process; and b) making a check of a resistivity by using the threshold value set in the step a) during the rinsing process.

The check of the resistivity is made by the use of an optimum threshold value depending on the type of liquid chemical forced out during the rinsing process.

According to the present invention, the method comprises the steps of: a) performing a first liquid chemical process using a first liquid chemical in the processing bath; b) supplying deionized water into the processing bath to force the first liquid chemical out of the processing bath, thereby performing a first rinsing process using the deionized water; c) supplying a second liquid chemical into the processing bath to force the deionized water out of the processing bath, thereby performing a second liquid chemical process using the second liquid chemical; and d) supplying deionized water into the processing bath to force the second liquid chemical out of the processing bath, thereby performing a second rinsing process using the deionized water, wherein a threshold value for use in checking the resistivity of a processing liquid during the first rinsing process in the step b) and a threshold value for use in checking the resistivity of a processing liquid during the second rinsing process in the step d) are set individually.

The check of the resistivity is made by the use of an optimum threshold value depending on the type of liquid chemical forced out during each of the first rinsing process and the second rinsing process.

Preferably, the first rinsing process and the second rinsing process are completed successfully, when the resistivity of the processing liquid stored in the processing bath reaches the threshold value set in the steps b) and d), respectively.

The proper completion of the rinsing process is achieved by using the threshold value individually set in each of the steps as a criterion.

The present invention is also intended for a substrate cleaning apparatus for cleaning a substrate by using a processing liquid.

According to the present invention, the substrate cleaning apparatus comprises: a processing bath for storing the processing liquid therein; a holding part for holding and immersing a substrate in the processing liquid stored in the processing bath; a resistivity measuring part for measuring the resistivity of the processing liquid stored in the processing bath; a supply part for supplying a first liquid chemical, deionized water and a second liquid chemical as the processing liquid into the processing bath; a controller for controlling the operation of the supply part supplying the processing liquid so that a first liquid chemical process using the first liquid chemical, a first rinsing process using the deionized water, a second liquid chemical process using the second liquid chemical and a second rinsing process using the deionized water are performed sequentially in the processing bath; and a resistivity checking part for making a check of a resistivity measured by the resistivity measuring part by using a first threshold value as a criterion during the first rinsing process, and for making a check of a resistivity measured by the resistivity measuring part by using a second threshold value as a criterion during the second rinsing process.

The check of the resistivity is made by the use of an optimum threshold value depending on the type of liquid chemical forced out during each of the first rinsing process and the second rinsing process.

Preferably, the controller completes the first rinsing process and the second rinsing process successfully when the resistivity in the resistivity checking part reaches the first threshold value and the second threshed value, respectively.

The proper completion of the rinsing process is achieved by using the first threshold value and the second threshold value as criteria.

Preferably, the substrate cleaning apparatus further comprises a threshold value setting part for individually setting the first threshold value and the second threshed value.

The first threshold value and the second threshold value are settable at any value, depending on the type of liquid chemical.

Preferably, the threshold value setting part sets the first threshold value and the second threshold value on a processing recipe which specifies processing details of a cleaning process.

The first threshold value and the second threshold value are easily settable in each step during the setting of the processing recipe.

It is therefore a general object of the present invention to provide a technique capable of making a check of a resistivity by using an optimum threshold value depending on the type of liquid chemical to achieve the proper completion operation of a rinsing process in a substrate cleaning apparatus of a one-bath type.

It is a more specific object of the present invention to provide a technique capable of suppressing reduction in yield and reduction in device characteristics by applying to a semiconductor device manufacturing process.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described with reference to the drawings.

<1. Overall Construction of Substrate Cleaning Apparatus>

Figure 1:
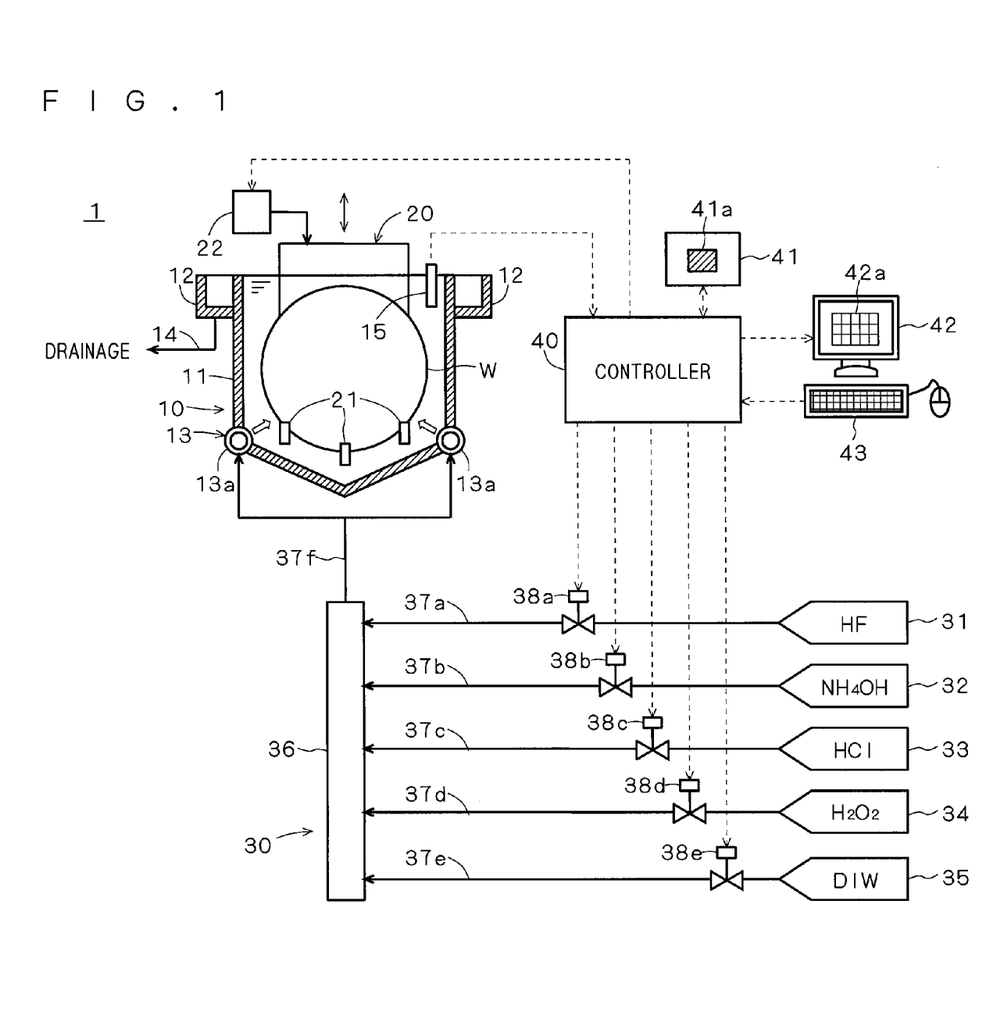
FIG. 1 shows the construction of a substrate cleaning apparatus according to a preferred embodiment of the present invention.

FIG. 1 shows the construction of a substrate cleaning apparatus 1 according to one preferred embodiment of the present invention. The substrate cleaning apparatus 1 is a substrate cleaning apparatus of what is called a one-bath type which cleans substrates W by sequentially performing a liquid chemical process using a liquid chemical and a rinsing process using deionized water upon the substrates W within a single processing bath 10. As illustrated in FIG. 1, the substrate cleaning apparatus 1 includes the processing bath 10 for storing a liquid chemical or deionized water therein, a lifter 20 for holding substrates W, a processing liquid supply part 30 for supplying a liquid chemical and deionized water (which are collectively referred to hereinafter as a "processing liquid") to the processing bath 10, and a controller 40 for controlling the operation of the components of the substrate cleaning apparatus 1.

The processing bath 10 is a container formed of a corrosion-resistant member for storing a liquid chemical or deionized water therein. The processing bath 10 includes an inner bath 11 which stores the liquid chemical or deionized water therein to allow a plurality of substrates W to be immersed in the liquid chemical or deionized water stored therein, and an outer bath 12 formed in an upper end portion of an outer peripheral surface of the inner bath 11. A discharge nozzle 13 for discharging the liquid chemical or deionized water toward the interior of the inner bath 11 is provided in a bottom portion of the inner bath 11. The discharge nozzle 13 has a pair of nozzle pipes 13a, and each of the nozzle pipes 13a is formed with a plurality of discharge openings (not shown). Thus, the liquid chemical or deionized water supplied to the nozzle pipes 13a is discharged from the plurality of discharge openings and stored in the interior of the inner bath 11. The processing liquid stored to reach a top portion of the inner bath 11 overflows through the top portion of the inner bath, is collected by the outer bath 12, and is then drained via a pipe 14 connected to the outer bath 12 to a drainage line in a factory.

A resistivity meter 15 is provided near the liquid surface of the processing liquid stored in the processing bath 10. The resistivity meter 15 includes a pair of metal electrodes, and has the function of measuring the electrical resistance of the processing liquid stored in the processing bath 10. For a resistivity check to be made after the rinsing process, the resistivity meter 15 measures the resistivity of the processing liquid, and sends the obtained resistivity as an electric signal to the controller 40. The resistivity meter 15 may incorporate a temperature sensor in the metal electrodes to send an equivalent of the resistivity at a predetermined temperature to the controller 40.

The lifter 20 is a transport mechanism for transporting a plurality of substrates W upwardly and downwardly while holding the plurality of substrates W collectively. The lifter 20 includes three holding rods 21 extending in a direction perpendicular to the plane of FIG. 1, and each of the holding rods 21 is formed with a plurality of holding grooves (not shown). The plurality of substrates W are held in parallel with each other in an upright position on the three holding rods 21, with peripheral portions of the respective substrates W fitted in the holding grooves. The lifter 20 is connected to a driver 22 shown conceptually in FIG. 1. When the driver 22 is operated, the lifter 20 which holds the substrates W moves upwardly and downwardly to transport the substrates W between an immersed position (the position of the substrates W shown in FIG. 1) which is inside the processing bath 10 and a raised position which is over the processing bath 10.

The processing liquid supply part 30 is a piping system for supplying a liquid chemical or deionized water into the processing bath 10. The processing liquid supply part 30 includes a hydrofluoric acid supply source 31, an ammonium hydroxide supply source 32, a hydrochloric acid supply source 33, a hydrogen peroxide supply source 34, a deionized water supply source 35, a mixing valve 36, a plurality of pipes 37a to 37f, and a plurality of on-off valves 38a to 38e in combination. The hydrofluoric acid supply source 31, the ammonium hydroxide supply source 32, the hydrochloric acid supply source 33, the hydrogen peroxide supply source 34 and the deionized water supply source 35 are connected to the mixing valve 36 through the pipes 37a, 37b, 37c, 37d and 37e, respectively. The on-off valves 38a, 38b, 38c, 38d and 38e are interposed in the pipes 37a, 37b, 37c, 37d and 37e, respectively. The mixing valve 36 is connected through the pipe 37f to the discharge nozzle 13 in the processing bath 10.

In such a processing liquid supply part 30, when the on-off valves 38b to 38d are closed and the on-off valves 38a and 38e are opened, hydrofluoric acid from the hydrofluoric acid supply source 31 and deionized water from the deionized water supply source 35 are supplied through the pipes 37a and 37e, respectively, to the mixing valve 36, and are mixed together in the mixing valve 36 to form dilute hydrofluoric acid. The formed dilute hydrofluoric acid is supplied from the mixing valve 36 through the pipe 37f to the discharge nozzle 13, and is discharged from the discharge nozzle 13 into the processing bath 10.

In such a processing liquid supply part 30, when the on-off valves 38a and 38c are closed and the on-off valves 38b, 38d and 38e are opened, ammonium hydroxide from the ammonium hydroxide supply source 32, hydrogen peroxide from the hydrogen peroxide supply source 34 and deionized water from the deionized water supply source 35 are supplied through the pipes 37b, 37d and 37e, respectively, to the mixing valve 36, and are mixed together in the mixing valve 36 to form an SC-1 solution. The formed SC-1 solution is supplied from the mixing valve 36 through the pipe 37f to the discharge nozzle 13, and is discharged from the discharge nozzle 13 into the processing bath 10.

In such a processing liquid supply part 30, when the on-off valves 38a and 38b are closed and the on-off valves 38c to 38e are opened, hydrochloric acid from the hydrochloric acid supply source 33, hydrogen peroxide from the hydrogen peroxide supply source 34 and deionized water from the deionized water supply source 35 are supplied through the pipes 37c, 37d and 37e, respectively, to the mixing valve 36, and are mixed together in the mixing valve 36 to form an SC-2 solution. The formed SC-2 solution is supplied from the mixing valve 36 through the pipe 37f to the discharge nozzle 13, and is discharged from the discharge nozzle 13 into the processing bath 10.

In such a processing liquid supply part 30, when the on-off valves 38a to 38d are closed and the on-off valve 38e is opened, deionized water from the deionized water supply source 35 is supplied through the pipe 37e, the mixing valve 36 and the pipe 37f to the discharge nozzle 13, and is discharged from the discharge nozzle 13 into the processing bath 10.

The controller 40 is a computer device for controlling the operation of the components of the substrate cleaning apparatus 1. The controller 40 is electrically connected to the resistivity meter 15, the driver 22 and the on-off valves 38a to 38e described above. The controller 40 is connected to a storage part 41 including a hard disk and a memory. A processing recipe 41a which specifies the processing details of the substrate cleaning apparatus 1 is stored in the storage part 41. The controller 40 brings the driver 22 and the on-off valves 38a to 38e into operation in accordance with the processing recipe 41a stored in the storage part 41 to cause the cleaning process of the substrates W to proceed.

As illustrated in FIG. 1, the controller 40 is connected to a display part 42 including a liquid crystal display device and the like, and an input part 43 including a keyboard and a mouse. The controller 40 is capable of causing a recipe setting screen 42a for the setting of the processing recipe 41a to be stored in the storage part 41 to appear on the display part 42. An operator of the substrate cleaning apparatus 1 can manipulate the input part 43 to make an entry while viewing the recipe setting screen 42a appearing on the display part 42, thereby performing the setting process of the processing recipe 41a.

Figure 2:
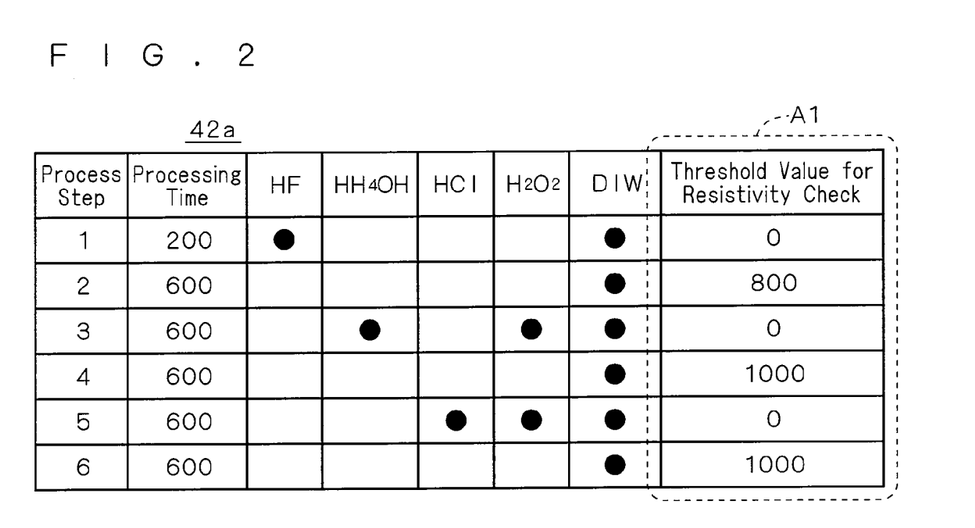
FIG. 2 shows an example of a recipe setting screen displayed on a display part.

FIG. 2 shows an example of the recipe setting screen 42a appearing on the display part 42. As illustrated in FIG. 2, processing time and the type of processing liquid to be supplied are settable for each process step on the recipe setting screen 42a. As illustrated in an area A1 in FIG. 2, a threshold value serving as a criterion of the check in the process of checking a resistivity in each process step is settable as a numeric value inherent in each process step on the recipe setting screen 42a. In other words, the substrate cleaning apparatus 1 is capable of setting threshold values differing between the plurality of process steps and performing the process of checking the resistivity by using the threshold value differing between the plurality of process steps.

For example, the recipe setting screen 42a of FIG. 2 shows that the threshold value for the checking process in Process Step 2 is set at 800 whereas the threshold values for the checking process in Process Steps 4 and 6 are set at 1000. In this manner, these threshold values are different. Thus, the substrate cleaning apparatus 1 checks the resistivity by using the threshold values differing between Process Step 2 and Process Steps 4 and 6. The recipe setting screen 42a of FIG. 2 shows that the threshold values for the checking process in Process Steps 1, 3 and 5 are zero, which indicates that the substantial checks of the resistivity are not made in Process Steps 1, 3 and 5. The settings made on the recipe setting screen 42a appearing on the display part 42 are sent through the controller 40 to the storage part 41, and are stored (or updated) as the processing recipe 41a in the storage part 41.

<2. Operation of Substrate Cleaning Apparatus>

Figure 3:
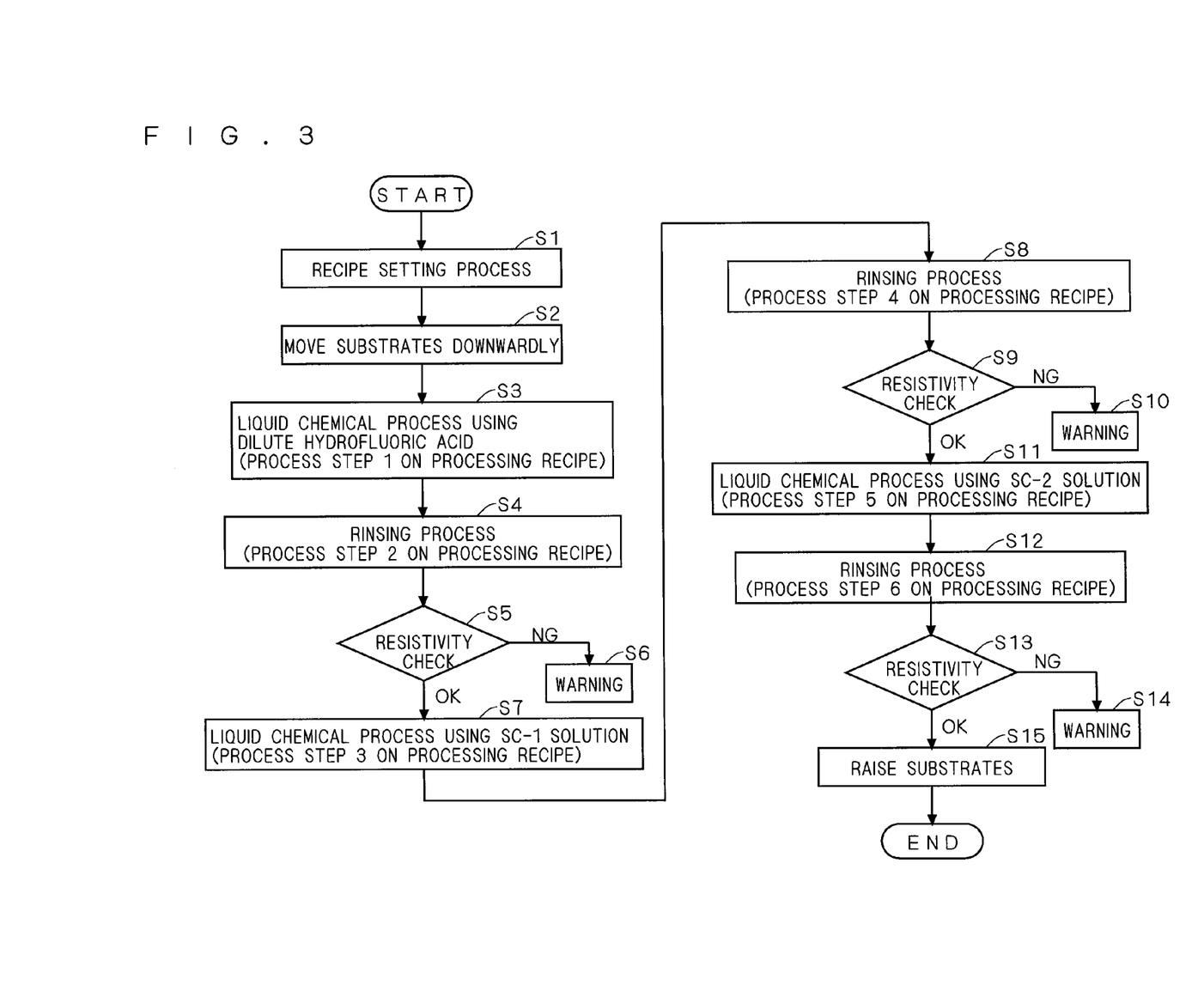
FIG. 3 is a flow chart showing a procedure of operation of the substrate cleaning apparatus.

Next, operation in the cleaning process of the substrate cleaning apparatus 1 having the above-mentioned construction will be described with reference to FIG. 1 and the flowchart of FIG. 3.

The substrate cleaning apparatus 1 performs the cleaning process on a group of substrates W in a manner to be described below. First, an operator manipulates the input part 43 to make an entry while viewing the recipe setting screen 42a appearing on the display part 42, thereby setting the processing recipe 41a (in Step S1). The operator sets the processing time and the type of processing liquid to be supplied in each process step. The operator also sets the threshold value for use in the process of checking the resistivity in each process step in the area A1 of the recipe setting screen 42a. It is assumed hereinafter that the process proceeds in accordance with the settings appearing on the recipe setting screen 42a of FIG. 2.

After the completion of the recipe setting process, the operator sets a group of unprocessed substrates W on the lifter 20, and enters a predetermined process start command from the input part 43. Upon receipt of the process start command from the input part 43, the controller 40 of the substrate cleaning apparatus 1 initially brings the driver 22 into operation to move the lifter 20 downwardly. This causes the substrates W with the lifter 20 to move downwardly to the immersed position inside the processing bath 10 (in Step S2).

Subsequently, the controller 40 closes the on-off valves 38b to 38d, and opens the on-off valves 38a and 38e. This causes hydrofluoric acid from the hydrofluoric acid supply source 31 and deionized water from the deionized water supply source 35 to mix together, thereby forming dilute hydrofluoric acid. The formed dilute hydrofluoric acid is discharged from the discharge nozzle 13 into the processing bath 10. The dilute hydrofluoric acid discharged from the discharge nozzle 13 is stored in the processing bath 10, and overflows through the top portion of the inner bath 11 into the outer bath 12 in due time. The substrates W are immersed in the dilute hydrofluoric acid stored in the processing bath 10, and are subjected to the liquid chemical process using the dilute hydrofluoric acid (in Process Step 1 on the processing recipe; and in Step S3).

After the completion of the liquid chemical process for a predetermined time period, the controller 40 closes the on-off valve 38a so that only the on-off valve 38e is open. This causes only the deionized water from the deionized water supply source 35 to be supplied through the mixing valve 36 to the discharge nozzle 13 and then to be discharged from the discharge nozzle 13 into the processing bath 10. The deionized water discharged into the processing bath 10 forces the dilute hydrofluoric acid in the processing bath 10 out of the processing bath 10 gradually. The dilute hydrofluoric acid in the processing bath 10 is replaced with deionized water. Then, the substrates W are subjected to the rinsing process using the deionized water stored in the processing bath 10 (in Process Step 2 on the processing recipe; and in Step S4).

When predetermined processing time has elapsed since the start of the rinsing process, the controller 40 receives the resistivity measured with the resistivity meter 15 to make a check of the received resistivity (in Step S5). Specifically, the controller 40 makes a comparison between the threshold value set in Process Step 2 on the processing recipe 41a and the resistivity received from the resistivity meter 15. When the resistivity is not less than the threshold value, the controller 40 completes the rinsing process successfully. On the other hand, when the resistivity is less than the threshold value, the controller 40 displays a predetermined warning message on the display part 42, and waits for a response from the operator (in Step S6).

After the rinsing process is completed successfully, the controller 40 opens the on-off valves 38b, 38d and 38e while the on-off valves 38a and 38c are closed. This causes ammonium hydroxide from the ammonium hydroxide supply source 32, hydrogen peroxide from the hydrogen peroxide supply source 34 and deionized water from the deionized water supply source 35 to mix together, thereby forming the SC-1 solution. The formed SC-1 solution is discharged from the discharge nozzle 13 into the processing bath 10. The SC-1 solution discharged into the processing bath 10 forces the deionized water in the processing bath 10 out of the processing bath 10 gradually. The deionized water in the processing bath 10 is replaced with the SC-1 solution. Then, the substrates W are subjected to the liquid chemical process using the SC-1 solution stored in the processing bath 10 (in Process Step 3 on the processing recipe; and in Step S7).

After the completion of the liquid chemical process for a predetermined time period, the controller 40 closes the on-off valves 38*b* and 38*d* so that only the on-off valve 38*e* is open. This causes only the deionized water from the deionized water supply source 35 to be supplied through the mixing valve 36 to the discharge nozzle 13 and then to be discharged from the discharge nozzle 13 into the processing bath 10. The deionized water discharged into the processing bath 10 forces the SC-1 solution in the processing bath 10 out of the processing bath 10 gradually. The SC-1 solution in the processing bath 10 is replaced with deionized water. Then, the substrates W are subjected to the rinsing process using the deionized water stored in the processing bath 10 (in Process Step 4 on the processing recipe; and in Step S8).

When predetermined processing time has elapsed since the start of the rinsing process, the controller 40 receives the resistivity measured with the resistivity meter 15 to make a check of the received resistivity (in Step S9). Specifically, the controller 40 makes a comparison between the threshold value set in Process Step 4 on the processing recipe 41*a* and the resistivity received from the resistivity meter 15. When the resistivity is not less than the threshold value, the controller 40 completes the rinsing process successfully. On the other hand, when the resistivity is less than the threshold value, the controller 40 displays a predetermined warning message on the display part 42, and waits for a response from the operator (in Step S10).

After the rinsing process is completed successfully, the controller 40 opens the on-off valves 38*c*, 38*d* and 38*e* while the on-off valves 38*a* and 38*b* are closed. This causes hydrochloric acid from the hydrochloric acid supply source 33, hydrogen peroxide from the hydrogen peroxide supply source 34 and deionized water from the deionized water supply source 35 to mix together, thereby forming the SC-2 solution. The formed SC-2 solution is discharged from the discharge nozzle 13 into the processing bath 10. The SC-2 solution discharged into the processing bath 10 forces the deionized water in the processing bath 10 out of the processing bath 10 gradually. The deionized water in the processing bath 10 is replaced with the SC-2 solution. Then, the substrates W are subjected to the liquid chemical process using the SC-2 solution stored in the processing bath 10 (in Process Step 5 on the processing recipe; and in Step S11).

After the completion of the liquid chemical process for a predetermined time period, the controller 40 closes the on-off valves 38*c* and 38*d* so that only the on-off valve 38*e* is open. This causes only the deionized water from the deionized water supply source 35 to be supplied through the mixing valve 36 to the discharge nozzle 13 and then to be discharged from the discharge nozzle 13 into the processing bath 10. The deionized water discharged into the processing bath 10 forces the SC-2 solution in the processing bath 10 out of the processing bath 10 gradually. The SC-2 solution in the processing bath 10 is replaced with deionized water. Then, the substrates W are subjected to the rinsing process using the deionized water stored in the processing bath 10 (in Process Step 6 on the processing recipe; and in Step S12).

When predetermined processing time has elapsed since the start of the rinsing process, the controller 40 receives the resistivity measured with the resistivity meter 15 to make a check of the received resistivity (in Step S13). Specifically, the controller 40 makes a comparison between the threshold value set in Process Step 6 on the processing recipe 41*a* and the resistivity received from the resistivity meter 15. When the resistivity is not less than the threshold value, the controller 40 completes the rinsing process successfully. On the other hand, when the resistivity is less than the threshold value, the controller 40 displays a predetermined warning message on the display part 42, and waits for a response from the operator (in Step S14).

After the rinsing process is completed successfully, the controller 40 closes the on-off valve 38*e* to stop the supply of deionized water. Then, the controller 40 brings the driver 22 into operation to move the lifter 20 upwardly, thereby raising the substrates W with the lifter 20 to over the processing bath 10 (in Step S15). This completes a sequence of cleaning process steps on the group of substrates W.

As described above, the substrate cleaning apparatus 1 according to this preferred embodiment is capable of individually setting the threshold value for use in checking the resistivity during the rinsing process on the recipe setting screen 42*a* in each process step. Thus, by setting each threshold value depending on the type of liquid chemical to be used immediately before the rinsing process, the substrate cleaning apparatus 1 can use an optimum threshold value during the rinsing process in each process step to make a check of the resistivity. This allows the proper completion of the rinsing process in each process step.

<3. Application to Semiconductor Device Manufacturing Process>

In a semiconductor device manufacturing process, the substrate cleaning apparatus 1 as discussed above may be used to perform pre-cleaning for the formation of a gate insulation film on the surface of a semiconductor wafer. Specifically, the substrate cleaning apparatus 1 may perform the process of cleaning semiconductor wafers in accordance with Steps S1 to S15 of FIG. 3 after setting the semiconductor wafers as the substrates W on the lifter 20. A sacrificial oxide film on the surfaces of the semiconductor wafers is mainly removed in the liquid chemical process using dilute hydrofluoric acid (in Step S3). Particles and metallic impurities on the surfaces of the semiconductor wafers are mainly removed in the liquid chemical process using the SC-1 solution (in Step S7) and in the liquid chemical process using the SC-2 solution (in Step S11).

Also, the substrate cleaning apparatus 1 is capable of individually setting the threshold value of the resistivity for use in the rinsing process subsequent to each of the liquid chemical processes. Thus, the substrate cleaning apparatus 1 uses an optimum threshold value for each of the hydrofluoric acid, the SC-1 solution and the SC-2 solution to properly recover the resistivity, thereby sufficiently removing the liquid chemical components (a hydrofluoric acid component, the SC-1 solution and the SC-2 solution) in the rinsing process subsequent to each liquid chemical process. This provides the minute film quality of the gate insulation film formed on the surface of each semiconductor wafer to attain the high-reliability gate insulation film free of withstand voltage failures.

<4. Modifications>

Although one preferred embodiment according to the present invention has been described hereinabove, the present invention is not limited to the above-mentioned specific embodiment. For example, although the dilute hydrofluoric acid, the SC-1 solution and the SC-2 solution are used as the liquid chemicals in the above-mentioned preferred embodiment, the liquid chemical supplied in the present invention may be other liquid chemicals. Further, the number of times the liquid chemical process and the rinsing process are executed in a single cleaning process is not limited to the above-mentioned number of times.

The above-mentioned substrate cleaning apparatus 1 performs only the liquid chemical process and the rinsing process upon the substrates W. However, a drying process may be performed on the substrates W subjected to the rinsing process in the substrate cleaning apparatus 1. As an example, the substrate cleaning apparatus 1 may be adapted to dry the surfaces of the substrates W by supplying IPA (isopropyl alcohol) vapor and reducing the pressure in a processing space after raising the substrates W to over the processing bath 10.

While the invention has been described in detail, the foregoing description is in all aspects illustrative and not restrictive. It is understood that numerous other modifications and variations can be devised without departing from the scope of the invention.

What is claimed is:

1. A method of cleaning a substrate, said method including sequentially performing a liquid chemical process using a liquid chemical and a rinsing process using deionized water upon a substrate in a single processing bath, said method comprising the steps of:
   a) setting a first resistivity threshold value;
   b) setting a second resistivity threshold value which is larger than said first resistivity threshold value;
   c) performing a first liquid chemical process using a first liquid chemical in said processing bath, wherein the first liquid chemical is hydrofluoric acid;
   d) supplying deionized water into said processing bath to force the first liquid chemical out of said processing bath, thereby performing a first rinsing process using the deionized water;
   e) supplying a second liquid chemical which is different from said first liquid chemical into said processing bath to force the deionized water out of said processing bath, thereby performing a second liquid chemical process using the second liquid chemical, wherein the second liquid chemical is an SC-1 solution; and
   f) supplying additional deionized water into said processing bath to force the second liquid chemical out of said processing bath, thereby performing a second rinsing process using the additional deionized water,
   wherein
   said step d) includes checking a resistivity of a first processing liquid comprising said deionized water and said first liquid chemical stored in said processing bath after a predetermined time period has elapsed since the start of the first rinsing process for rinsing said first liquid chemical using said deionized water, and said first rinsing process is judged to be completed successfully, when the resistivity of said first processing liquid stored in said processing bath reaches said first resistivity threshold value, and
   in said step f), the resistivity of a second processing liquid comprising said additional deionized water and said second liquid chemical stored in said processing bath is checked after a given time period has elapsed since the start of the second rinsing process for rinsing said second liquid chemical using said additional deionized water, and said second rinsing process is judged to be completed successfully, when the resistivity of said second processing liquid stored in said processing bath reaches said second resistivity threshold value.

2. A method of cleaning a substrate, said method including sequentially performing a liquid chemical process using a liquid chemical and a rinsing process using deionized water upon a substrate in a single processing bath, said method comprising the steps of:
   a) setting a first resistivity threshold value;
   b) setting a second resistivity threshold value which is larger than said first resistivity threshold value;
   c) performing a first liquid chemical process using a first liquid chemical in said processing bath, wherein the first liquid chemical is hydrofluoric acid;
   d) supplying deionized water into said processing bath to force the first liquid chemical out of said processing bath, thereby performing a first rinsing process using the deionized water;
   e) supplying a second liquid chemical which is different from said first liquid chemical into said processing bath to force the deionized water out of said processing bath, thereby performing a second liquid chemical process using the second liquid chemical, wherein the second liquid chemical is an SC-2 solution; and
   f) supplying additional deionized water into said processing bath to force the second liquid chemical out of said processing bath, thereby performing a second rinsing process using the additional deionized water,
   wherein
   said step d) includes checking a resistivity of a first processing liquid comprising said deionized water and said first liquid chemical stored in said processing bath after a predetermined time period has elapsed since the start of the first rinsing process for rinsing said first liquid chemical using said deionized water, and said first rinsing process is judged to be completed successfully, when the resistivity of said first processing liquid stored in said processing bath reaches said first resistivity threshold value, and
   in said step f), the resistivity of a second processing liquid comprising said additional deionized water and said second liquid chemical stored in said processing bath is checked after a given time period has elapsed since the start of the second rinsing process for rinsing said second liquid chemical using said additional deionized water, and said second rinsing process is judged to be completed successfully, when the resistivity of said second processing liquid stored in said processing bath reaches said second resistivity threshold value.

3. A method of cleaning a substrate, said method including sequentially performing a liquid chemical process using a liquid chemical and a rinsing process using deionized water upon a substrate in a single processing bath, said method comprising the steps of:
   a) setting a first resistivity threshold value;
   b) setting a second resistivity threshold value which is larger than said first resistivity threshold value;
   c) performing a first liquid chemical process using a first liquid chemical in said processing bath, wherein the first liquid chemical is an SC-1 solution;
   d) supplying deionized water into said processing bath to force the first liquid chemical out of said processing bath, thereby performing a first rinsing process using the deionized water;
   e) supplying a second liquid chemical which is different from said first liquid chemical into said processing bath to force the deionized water out of said processing bath, thereby performing a second liquid chemical process using the second liquid chemical, wherein the second liquid chemical is an SC-2 solution; and
   f) supplying additional deionized water into said processing bath to force the second liquid chemical out of said processing bath, thereby performing a second rinsing process using the additional deionized water,
   wherein said step d) includes checking a resistivity of a first processing liquid comprising said deionized water and said first liquid chemical stored in said processing bath after a predetermined time period has elapsed since the start of the first rinsing process for rinsing said first liquid chemical using said deionized water, and said first rinsing process is judged to be completed successfully, when the resistivity of said first processing liquid stored in said processing bath reaches said first resistivity threshold value, and in said step f), the resistivity of a second processing liquid comprising said additional deionized water and said second liquid chemical stored in said processing bath is checked after a given time period has elapsed since the start of the second rinsing process for rinsing said second liquid chemical using said additional deionized water, and said second rinsing process is judged to be completed successfully, when the resistivity of said second processing liquid stored in said processing bath reaches said second resistivity threshold value.

* * * * *